United States Patent
Wu et al.

(10) Patent No.: US 9,154,150 B1
(45) Date of Patent: Oct. 6, 2015

(54) INTERLEAVED MULTIPLE-STAGE CAPACITOR AND AMPLIFIER SHARING IN AN ADC

(71) Applicant: Broadcom Corporation, Irvine, CA (US)

(72) Inventors: Jiangfeng Wu, Aliso Viejo, CA (US); Wei-Te Chou, Dana Point, CA (US); Rong Wu, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/336,916

(22) Filed: Jul. 21, 2014

Related U.S. Application Data

(60) Provisional application No. 62/022,512, filed on Jul. 9, 2014.

(51) Int. Cl.
  *H03M 1/12* (2006.01)
(52) U.S. Cl.
  CPC .................................... *H03M 1/124* (2013.01)
(58) Field of Classification Search
  USPC .................. 341/118, 120, 155, 161, 162, 172
  See application file for complete search history.

(56) References Cited

U.S. PATENT DOCUMENTS

| | | | |
|---|---|---|---|
| 6,600,440 B1 * | 7/2003 | Sakurai | 341/172 |
| 7,009,549 B1 * | 3/2006 | Corsi | 341/161 |
| 7,026,968 B1 * | 4/2006 | Ali | 341/120 |
| 7,164,779 B2 * | 1/2007 | Yerazunis et al. | 382/100 |
| 8,339,303 B2 * | 12/2012 | Ali et al. | 341/162 |
| 8,730,073 B1 * | 5/2014 | Wang et al. | 341/122 |
| 8,742,961 B2 * | 6/2014 | de Figueiredo et al. | 341/118 |
| 8,779,963 B1 * | 7/2014 | Bales | 341/161 |
| 2007/0046510 A1 * | 3/2007 | Zanchi et al. | 341/75 |
| 2009/0128391 A1 * | 5/2009 | Bailey et al. | 341/172 |
| 2012/0326901 A1 * | 12/2012 | Zhao et al. | 341/118 |

* cited by examiner

*Primary Examiner* — Linh Nguyen

(74) *Attorney, Agent, or Firm* — Garlick & Markison; Bruce E. Garlick

(57) ABSTRACT

An analog-to-digital converter (ADC) utilizing a capacitor array during multiple conversion stages and amplifier sharing across multiple lanes. In various embodiments, the ADC includes N lanes, each of the lanes including a capacitor array. A plurality of switches coupled to each capacitor array selectively redistributes a sampled charge during N clock phases corresponding to N conversion stages, the conversion stages including a sampling stage performed on an analog input signal, at least one quantization stage, and N−2 multiplying digital-to-analog conversion (MDAC) stages for generating residue voltages. The MDAC stages utilize a plurality of N−2 amplifiers shared by the N lanes. In operation, each amplifier may be used in an interleaved manner to support, during a given clock phase, an MDAC stage of one of the lanes of the ADC. Likewise, one or more comparators of a lane may be leveraged to perform multiple quantization stages during the N clock phases.

20 Claims, 10 Drawing Sheets

US 9,154,150 B1

INTERLEAVED MULTIPLE-STAGE CAPACITOR AND AMPLIFIER SHARING IN AN ADC

CROSS REFERENCE TO RELATED PATENTS/PATENT APPLICATIONS

Provisional Priority Claims

The present U.S. Utility Patent Application claims priority pursuant to 35 U.S.C. §119(e) to U.S. Provisional Application No. 62/022,512, entitled "INTERLEAVED MULTIPLE-STAGE CAPACITOR AND AMPLIFIER SHARING IN AN ADC", filed Jul. 9, 2014, which is hereby incorporated herein by reference in its entirety and made part of the present U.S. Utility Patent Application for all purposes.

BACKGROUND

1. Technical Field

The present disclosure relates to analog-to-digital converters (ADCs) and, more particularly, to an ADC utilizing a capacitor array during multiple conversion stages and amplifier sharing across multiple lanes.

2. Description of Related Art

Analog-to-digital converters (ADCs) are utilized in many products and applications requiring conversion of an analog signal into digital signal. For example, ADCs are a critical component of both wideband and narrowband communication receivers. In such applications, power consumption and area requirements may impose practical limitations on ADC resolution and/or architecture.

The resolution quality of an ADC is often specified by an effective number of bits (ENOB), which is the number of bits representing an input signal, excluding the number of bits representing noise. In traditional ADC architectures, such as pipeline ADCs for example, the ENOB may be limited by kT/C noise to ~10b at multi-GS/s rates without relatively high power consumption. Further, conventional pipeline ADCs may take several steps before the first quantization step, in which input signal sampling, a sample-and-hold amplifier and a first multiplying digital-to-analog (MDAC) stage may all contribute noise and distortion. Some techniques to reduce these steps require splitting of a clock period, which may limit the sample rate of an ADC. Other techniques to reduce these steps involve auxiliary circuitry which may add design complexities and increase power consumption.

DETAILED DESCRIPTION

Figure 1:
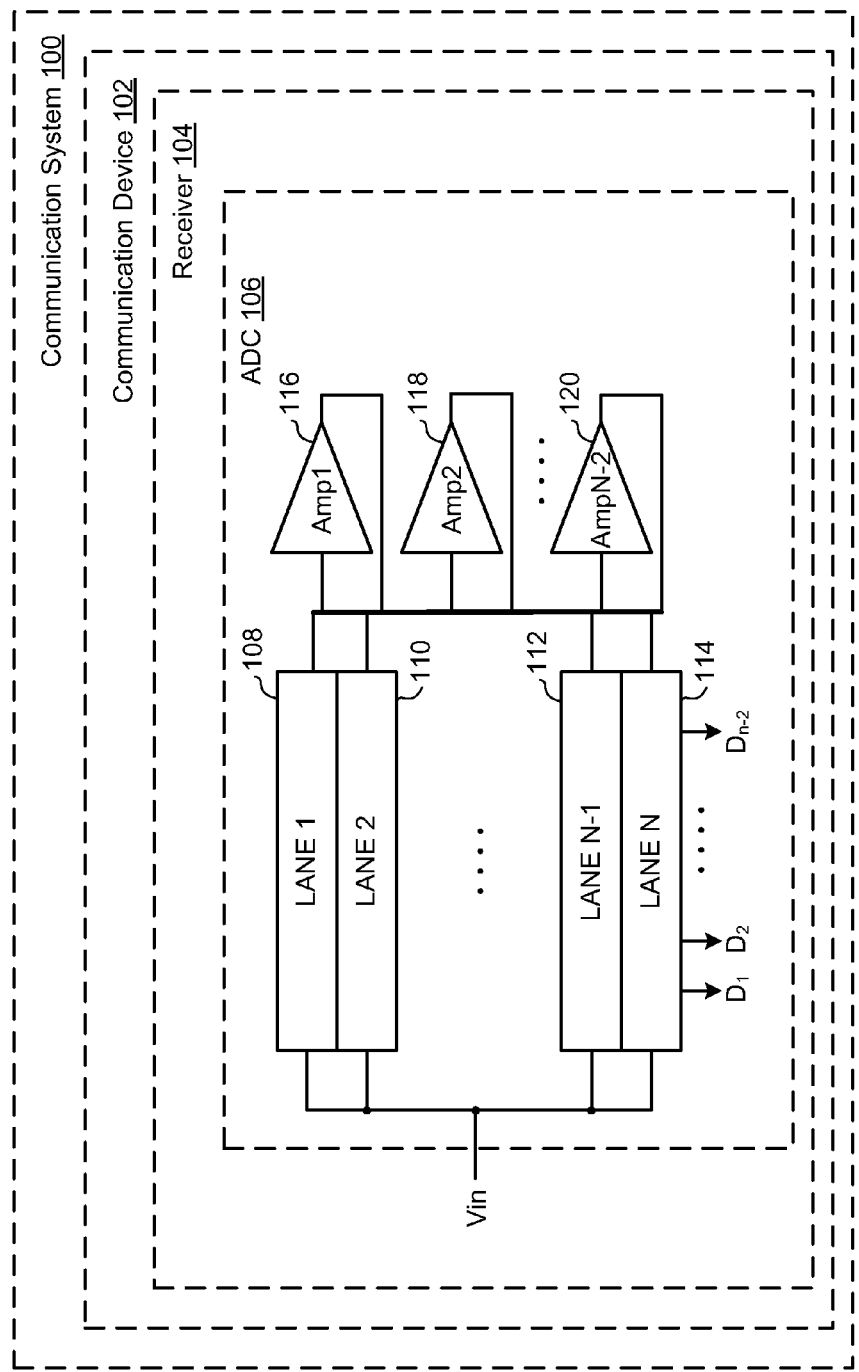
FIG. 1 is a block diagram illustrating an exemplary embodiment of a communication system including a communication device with an N-lane multi-stage ADC according to the disclosure.

FIG. 1 is a block diagram illustrating an exemplary embodiment of a communication system 100 including a communication device 102 incorporating an N-lane multi-stage analog-to-digital converter (ADC) according to the disclosure. In particular, the communication device 102 includes a receiver 104 having an ADC 106 utilizing an N-lane multi-stage architecture. While the various embodiments of ADC 106 described below pertain generally to pipeline ADC architectures, the concepts presented herein can be extended to other types of ADCs, including but not limited to sub-range, cyclic and successive approximation ADCs.

The ADC 106 of FIG. 1 includes a plurality of N lanes 108-114. As described more fully in conjunction with the exemplary embodiments of FIGS. 2-4, each lane of the N lanes includes a capacitor array that is utilized across multiple stages (or steps) of an analog-to-digital conversion process. For example, the same capacitor array may be shared between N conversion stages in which the charge sampled from an input signal is effectively preserved and redistributed in N clock phases corresponding to the N stages. The N stages include, for example, one or more of each of a sampling stage performed on a voltage Vin of an analog input signal, a quantization stage, and N−2 multiplying digital-to-analog conversion (MDAC) stages for generating residue voltages for use in further quantization stages. The lanes 108-114 utilize one or more of a plurality of N−2 amplifiers 116, 118-120 during such MDAC stages. The analog input signal may be a continuous-time waveform, such as a buffered or un-buffered signal from front-end circuitry (not separately illustrated) of the receiver 104.

Communication system 100 may be any wired and/or wireless communication system utilizing one or more communication protocols to transfer voice, video, data and/or other types of information, including, but not limited to, terrestrial TV (television), cable, satellite, multi-media over coax alliance (MoCA), uWave, WiFi, WiMax and cellular communication systems. Communication device 102 may be any wired or wireless communication device, including, but not limited to, a TV, cable or satellite set top box, a cellular device (e.g., a smart phone), a transceiver, an access point, a router, a modem, and/or other type of communication device. Receiver 104 may be a standalone receiver or a receiver in any such communication device or system.

The ADC 106 may be suitable, for example, for use in a wideband or narrowband receiver with stringent performance requirements (e.g., requiring 11-12b ENOB and/or a high sample rate) including, for example, applications involving cable, multi-media over coax alliance (MoCA), WiFi, terrestrial TV, cellular baseband, universal RF, etc. The novel architecture of ADC 106 supports such applications through higher sampling rates, improved noise and distortion performance, and lower energy consumption as compared to traditional architectures. ADCs implemented in accordance with the disclosed architectures have the flexibility to meet ENOB-related requirements for some applications, while providing critical power savings for other applications.

Figure 2:
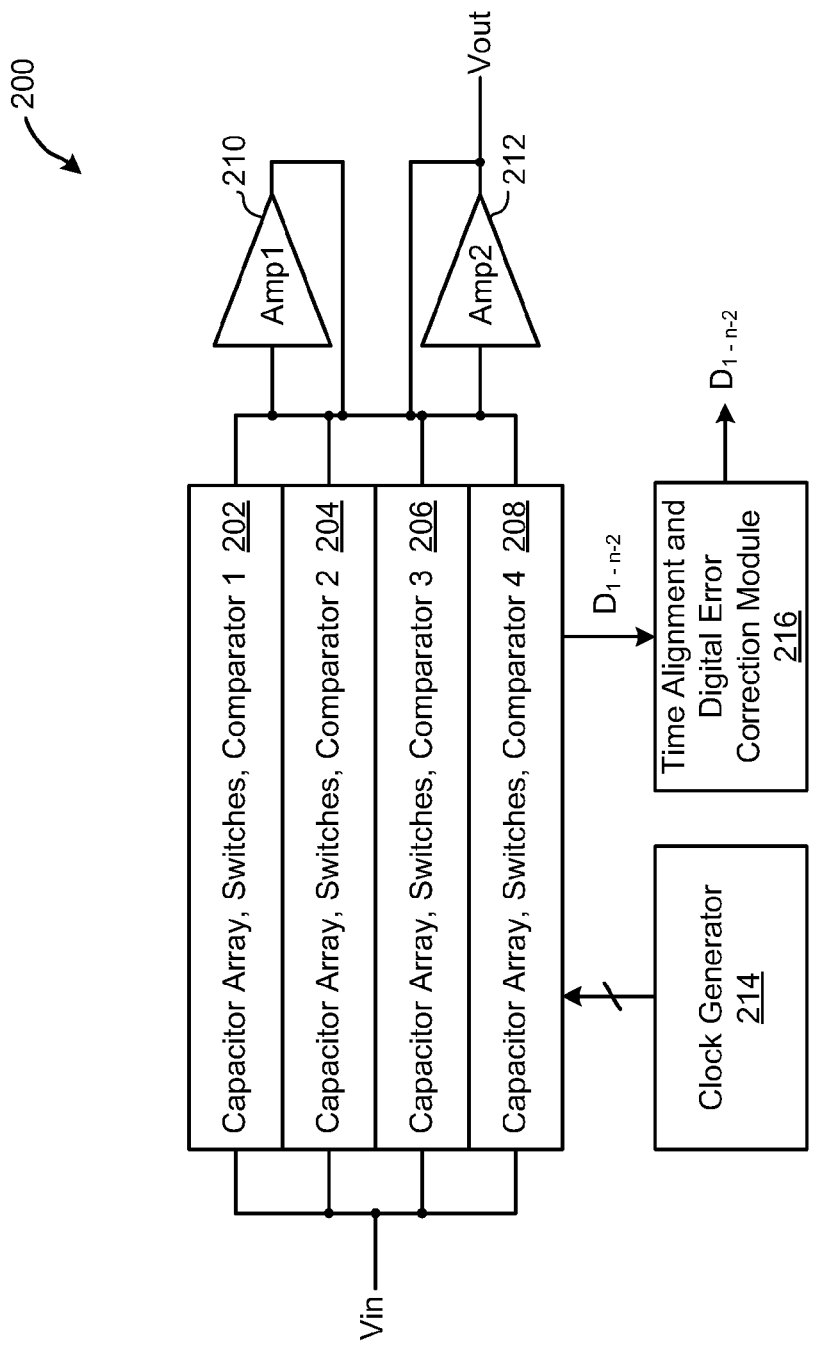
FIG. 2 is a block diagram of an exemplary 4-lane ADC utilizing multi-stage capacitor sharing and amplifier sharing.

FIG. 2 is a block diagram of an exemplary 4-lane ADC 200 utilizing multi-stage capacitor sharing and amplifier sharing. In particular, the illustrated ADC 200 includes four interleaved lanes 202, 204, 206 and 208 of switches, capacitors and comparators sharing a first amplifier 210 and a second amplifier 212. Within each lane 202-208, the capacitor array is shared between four conversion stages. As shown in FIG. 1, this configuration can be generalized to a greater or lesser number of N interleaved lanes sharing N−2 amplifiers in N conversion stages.

In various embodiments, each clock phase described herein may be derived from one or more master clock signals generated by or provided to clock generator 214. In addition, the quantization output bits generated by the ADC 200 may be conditioned by a time alignment and digital error correction module 216 to generate a highly accurate digital representation $D_1$−n−2 of a sample voltage for use, e.g., in digital signal processing operations. The clock generator 214 and time alignment and (optionally) digital error correction module 216 may be discrete modules/circuits, or implemented by one or more processing modules, processing units or general purpose processing circuitry of a device.

In exemplary operation of a lane 202-208, an analog input signal Vin is sampled in a first stage and stored across multiple capacitors of a capacitor array to establish a sampled voltage for use in subsequent conversion stages (or steps). In a second stage, a first quantization is performed on the sampled voltage. The first quantization stage may be performed by one or more comparators of the lane, and generates the first n bits of a digital representation of the sampled voltage. In certain embodiments, the first quantization stage utilizes a sampled voltage stored in a single unit capacitor of the capacitor array.

In a third stage, a first MDAC operation is performed to produce a first residue voltage. Charge is distributed across portions of the capacitor array during this stage such that the first residue voltage is based on the sampled voltage and a voltage derived from the n bits and a reference voltage(s). A quantization of the first residue voltage is also performed during this stage to produce the next m bits of the digital representation of the sampled voltage. In some embodiments, n may equal m, in which case the same number of comparators is utilized by each quantization stage.

In a fourth stage, a second MDAC operation is performed to produce a second residue voltage. Charge is again distributed across portions (e.g., a feedback portion as described below) of the capacitor array during this stage such that the second residue voltage is based on the first residue voltage and a voltage derived from the m bits and a reference voltage (s). In this manner, the capacitor array is utilized to redistribute charge used during multiple conversion stages/operations, thereby reducing noise and distortion by reducing the number of charge transfers as compared to traditional ADC architectures. As described elsewhere herein, amplification for the first and second MDAC operations may be performed by a plurality of amplifiers shared by multiple lanes of the ADC in an interleaved manner.

Figure 3:
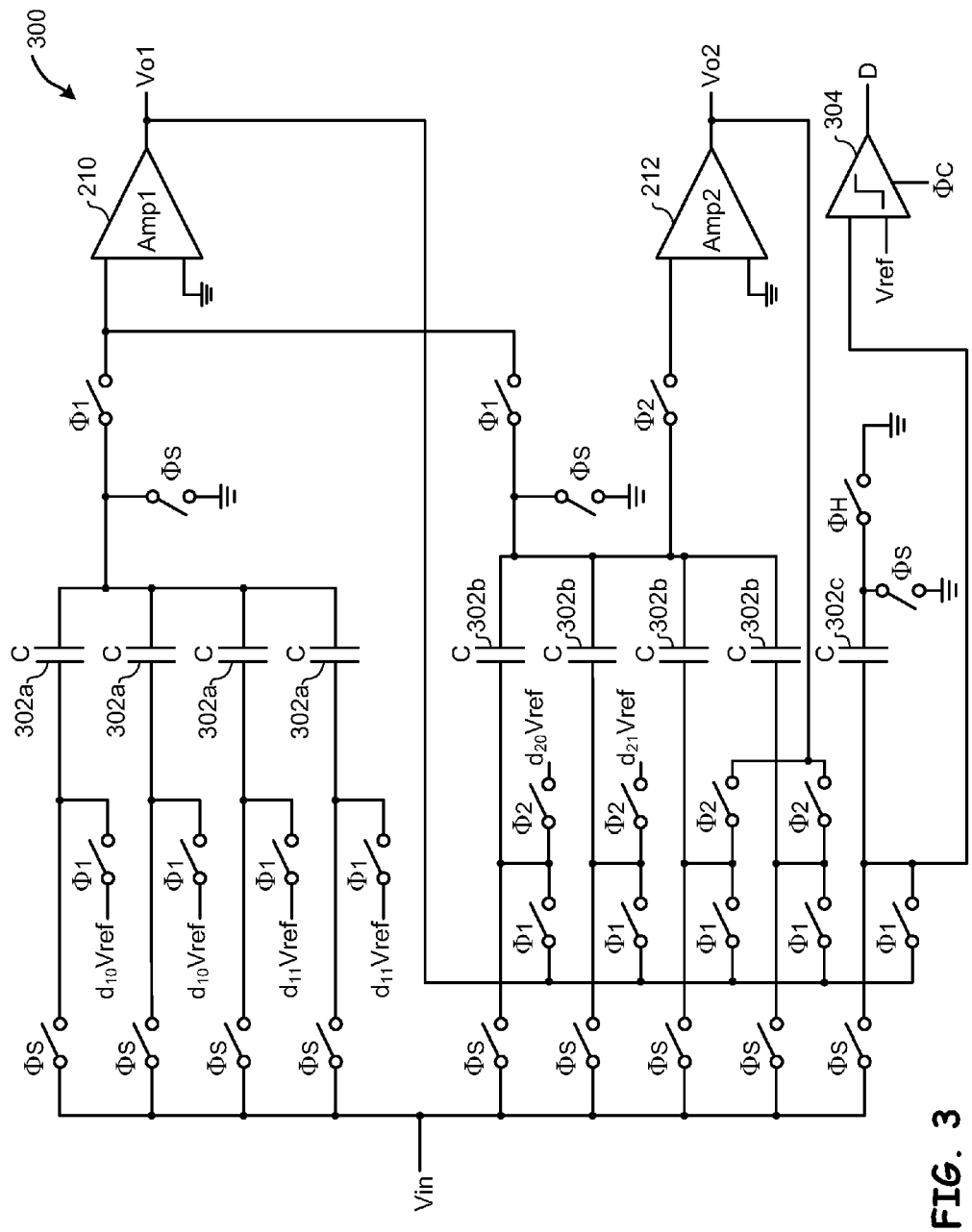
FIG. 3 is a circuit diagram illustrating an exemplary embodiment of one lane of the ADC of FIG. 2.

FIG. 3 is a circuit diagram illustrating an exemplary embodiment 300 of one lane of the ADC of FIG. 2. In particular, a capacitor array 302 (formed by nine capacitors 302a, 302b and 302c) is utilized over a multiple conversion stages. Timing of the conversion stages and selective storage and redistribution of charges in the capacitor array 302 is governed through a plurality of clock signals or phases $\Phi_S$, $\Phi_H$, $\Phi_1$ and $\Phi_2$ that control a plurality of switches coupled to individual ones of the capacitors of the capacitor array 302.

An exemplary timing diagram showing timing of the clock phases for the switches is described below in conjunction with FIG. 8. In certain embodiments, the conversion stages include a sampling stage, one or more quantization stages, and a plurality of MDAC stages.

Comparator 304, which is controlled by a clock phase $\Phi_C$, may comprise a plurality of comparators corresponding to a desired quantization resolution, is shared over one or more quantization stages. As described more fully in conjunction with FIGS. 6 and 7, the amplifiers 210 and 212 generate residue signals by subtracting voltages derived in part from the output bits of comparator 304 from voltages stored in various portions (e.g., a feedback portion) of the capacitor array 302. Residue amplification is achieved through by redistributing a charge stored in a first portion of the capacitor array 302 to a second portion of the capacitor array 302.

As will be appreciated, other topology variations may be implemented without departing from the spirit of the disclosure. For example, additional amplifiers and capacitor sharing and/or splitting may be employed to implement additional stages in a pipeline ADC architecture, wherein a single capacitor array is utilized regardless of the number of stages. Further, although a single-ended configuration is shown, both single-ended and differential configurations may be used.

Figure 4:
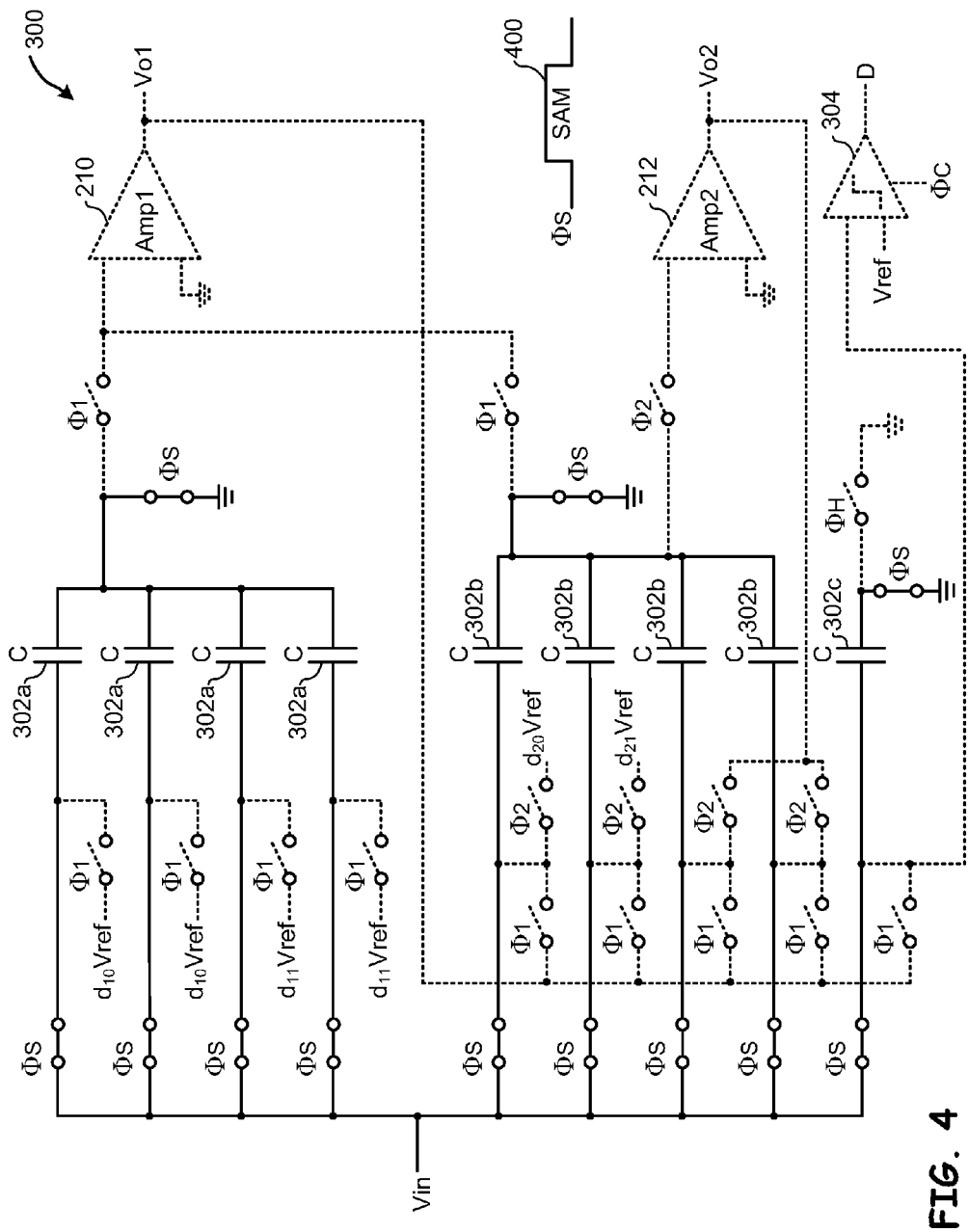
FIG. 4 is a circuit diagram illustrating exemplary operation of the ADC of FIG. 3 during an analog input signal sampling stage.

FIG. 4 is a circuit diagram illustrating exemplary operation of the ADC of FIG. 3 during an analog input signal sampling stage. In particular, during this stage the switches controlled by a clock phase $\Phi_S$ 400 are closed such that an input signal is sampled to capacitors 302a, capacitors 302b and capacitor 302c for use in the subsequent stages. In particular, the charge sampled to capacitors 302a and 302b may be re-distributed in the first and second MDAC stages in order to generate residue voltages. Due to the identical sampling process, no timing mismatch exists between the paths to capacitors 302a, 302b and 302c, which is a common issue in ADC architectures that do not utilize a sample-and-hold amplifier (SHA), often referred to as SHA-less architectures.

Figure 5:
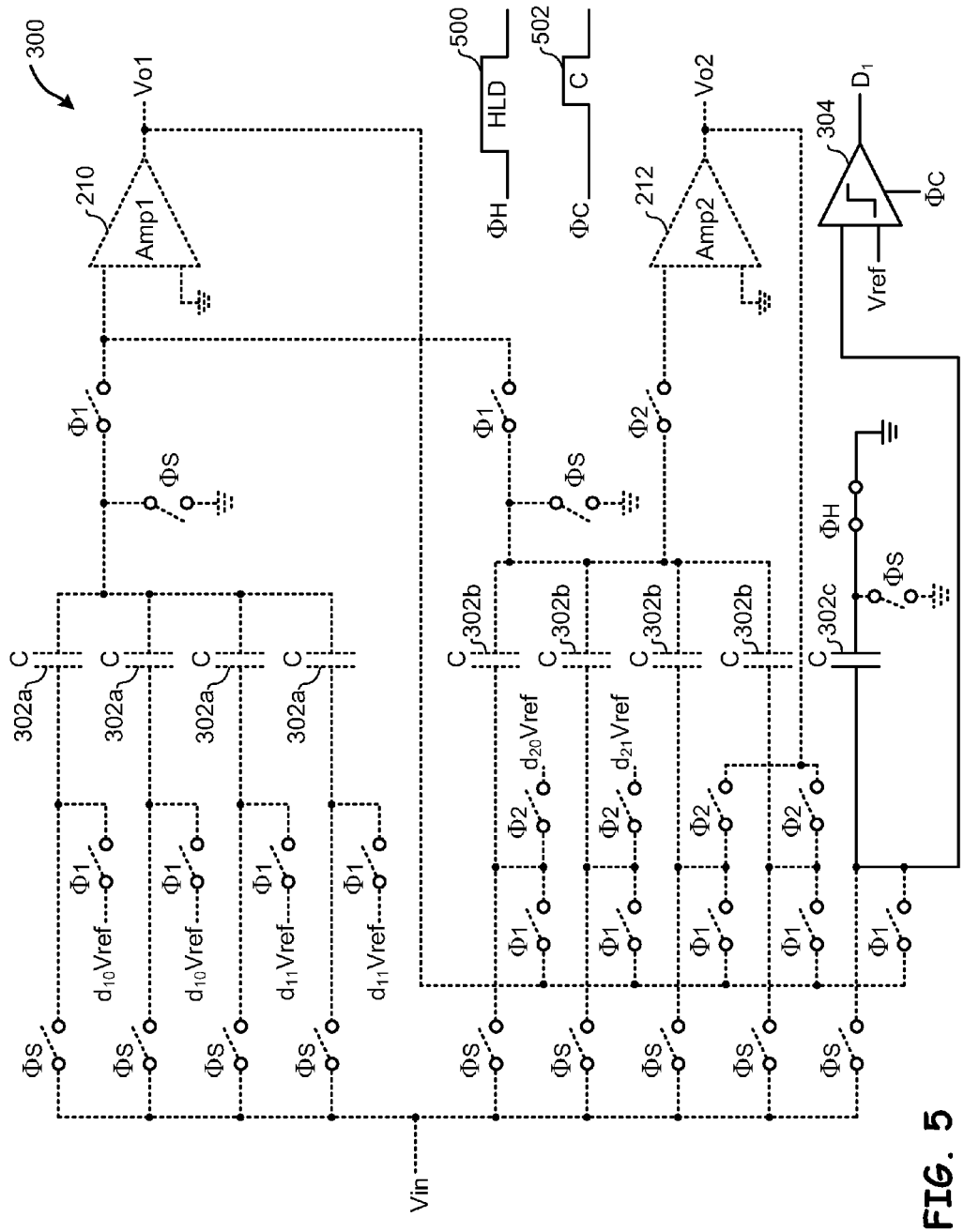
FIG. 5 is a circuit diagram illustrating exemplary operation of the ADC of FIG. 3 during a first quantization stage.

FIG. 5 is a circuit diagram illustrating exemplary operation of the ADC of FIG. 3 during a first quantization stage. In this stage, the switches controlled by $\Phi_S$ are open while the switch controlled by clock phase $\Phi_H$ 500 is closed in order to hold the sampled voltage across capacitor 302c as seen at one input of the quantization comparator 304. During this stage, the clock phase $\Phi_C$ 502 is also asserted such that the comparator 304 performs a comparison (or quantization) of the voltage across capacitor 302c to a reference voltage Vref in order generate a first quantization output bit. In the illustrated 1.5 bit MDAC embodiment, two comparators may be utilized to generate first and second bits $d_{10}$ and $d_{11}$ for use in the first MDAC stage. In alternate embodiments, the comparator 304 may be interleaved between two lanes.

It is noted in the illustrated embodiment, a hold operation is performed without requiring a SHA. Further, the same capacitor 302c is in the same configuration in both the sample and hold stages. This permits the comparator(s) to receive the input signal without errors due to charge transfer, timing, etc. In certain embodiments, bottom plates of the capacitors may be coupled, thereby canceling out some noise that may otherwise be introduced during a conversion process. The reference voltage(s) Vref (or threshold voltages) may be generated, for example, by a resistor divider (e.g., Vref, ½ Vref, ¼ Vref, etc.).

Figure 6:
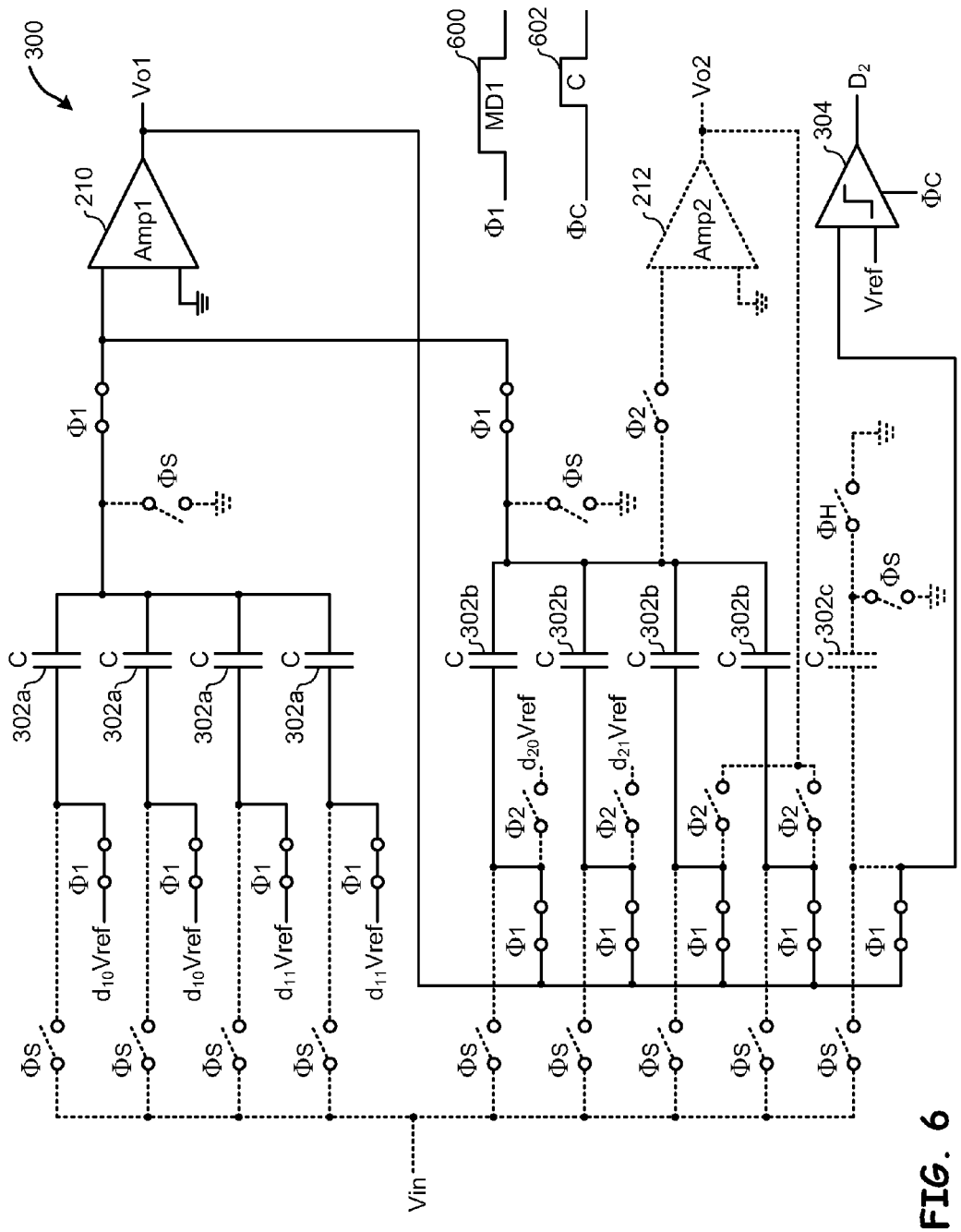
FIG. 6 is a circuit diagram illustrating exemplary operation of the ADC of FIG. 3 during a first multiplying digital-to-analog conversion (MDAC) stage.

FIG. 6 is a circuit diagram illustrating exemplary operation of the ADC of FIG. 3 during a first multiplying digital-to-analog conversion (MDAC) stage. In this stage, the switches controlled by clock phase $\Phi_1$ 600 are closed, such that the charge stored in capacitors 302a (which are selectively coupled to Vref as determined by bits $d_{10}$ and $d_{11}$) is redistributed to capacitors 302b which are coupled to the output of a first amplifier 210. The resulting residue voltage/charge is stored in capacitors 302b instead of being sample to another capacitor. This configuration reduces noise and distortion as compared to traditional ADC architectures by eliminating one charge transfer. This configuration also reduces amplifier loading by mitigating the need for an output sampling capacitor, leading to lower amplifier power consumption.

During this clock phase, the clock phase $\Phi_C$ 602 is again asserted such that the comparator 304 performs a second comparison (or quantization) on the residue voltage in order generate a second to generate additional quantization bits, which may be utilized in the next MDAC stage. It is noted that when all lanes of the ADC 200 have the same resolution, the reference voltages may be the same for all quantizing and MDAC stages. For a given MDAC stage, the residue voltage may be determined by multiplying the reference voltage Vref and the bits generated during a prior quantization stage, and subtracting the product from a sampled voltage or prior residue voltage and amplifying the result through charge redistribution to smaller capacitors.

Figure 7:
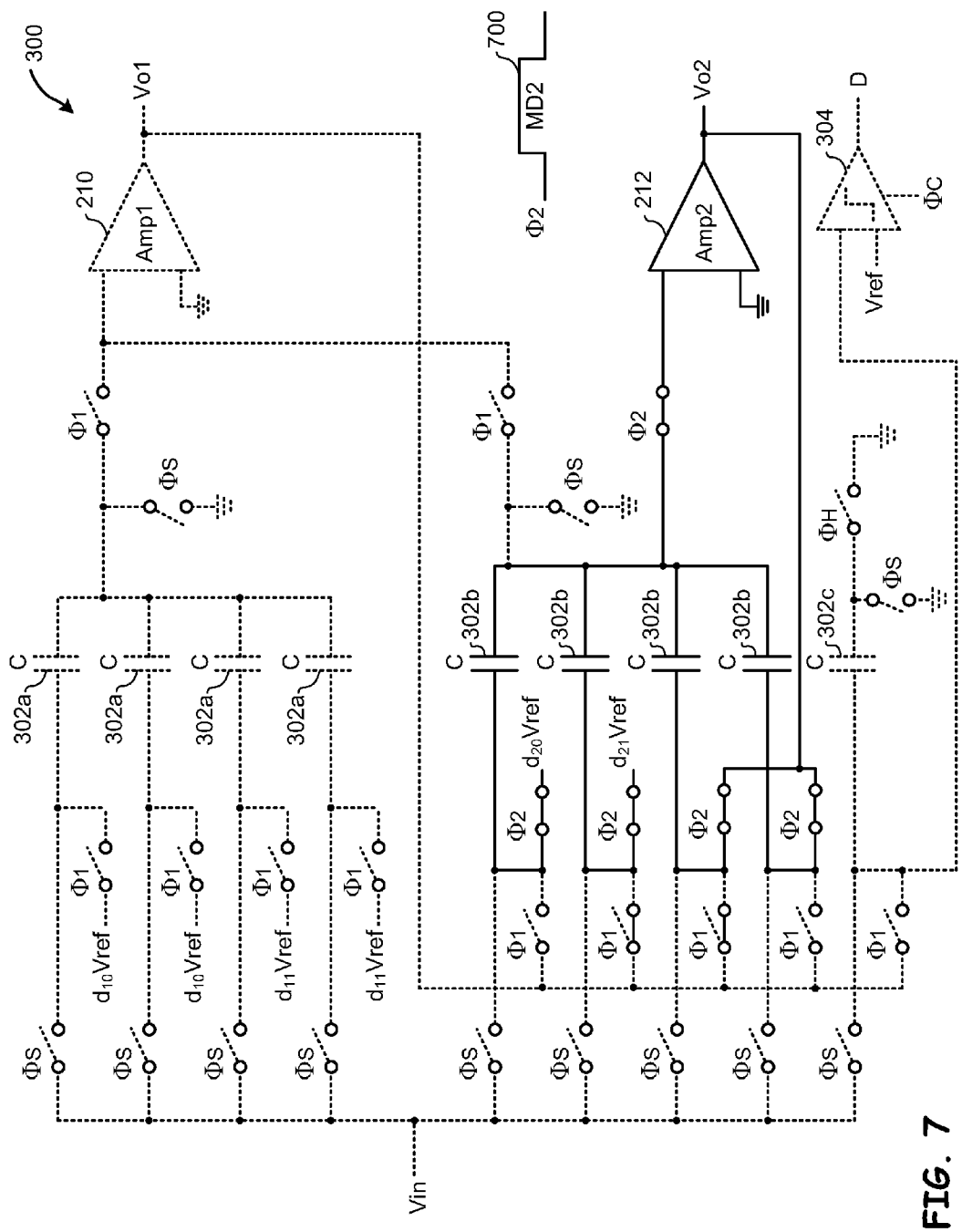
FIG. 7 is a circuit diagram illustrating exemplary operation of the ADC of FIG. 3 during a second MDAC stage.

FIG. 7 is a circuit diagram illustrating exemplary operation of the ADC of FIG. 3 during a second MDAC stage. In this stage, the switches controlled by clock phase $\Phi_2$ 700 are closed, such that the charge stored in two of the capacitors 302b (which are selectively coupled to Vref as determined by bits $d_{20}$ and $d_{21}$) is re-distributed to the other two capacitors 302b, which are coupled to the output of a second amplifier 212. During this stage, the resulting residue voltage may be sampled to another capacitor (not shown) at amplifier output Vo2 for use in a further quantization process (e.g., generation of LSBs by a flash ADC).

Figure 8:
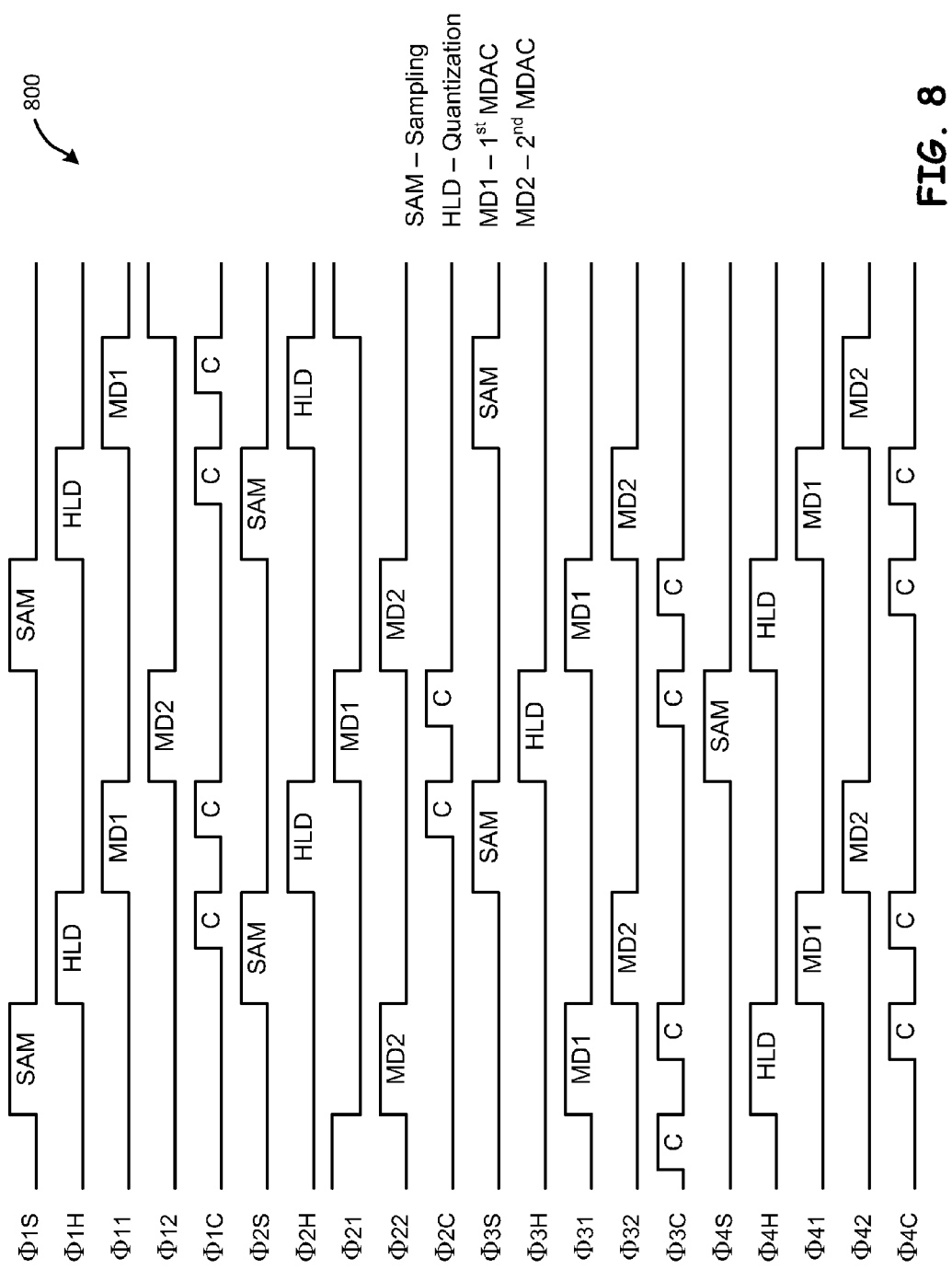
FIG. 8 is a timing diagram illustrating exemplary clock phases for a 4-lane ADC according to the disclosure.

FIG. 8 is a timing diagram illustrating exemplary clock phases 800 for a 4-lane ADC according to the disclosure. In particular, a timing diagram is presented that shows the relationship between $\Phi_S$, $\Phi_H$, $\Phi_1$, $\Phi_2$ and $\Phi_C$ across the 4 lanes, wherein $\Phi_S$ corresponds to a sampling (SAM) stage, $\Phi_H$ corresponds to a hold or quantization stage (HLD), $\Phi_1$ corresponds to a first MDAC stage (MD1) and $\Phi_2$ corresponds to a first MDAC stage (MD1). In the illustrated timing diagram, the clock phases $\Phi_{1S}$-$\Phi_{1C}$ operate on a first lane, clock phases $\Phi_{2S}$-$\Phi_{2C}$ operate on a second lane, clock phases $\Phi_{3S}$-$\Phi_{3C}$ operate on a third lane and clock phases $\Phi_{4S}$-$\Phi_{4C}$ operate on a fourth lane of the ADC.

It is noted that the various clock phases $\Phi_S$, $\Phi_H$, $\Phi_1$, $\Phi_2$ and $\Phi_C$ are interleaved over the 4 lanes such that the amplifiers shared by the lanes to perform MDAC operations are effectively never idle in pipelined operations, which results in a fewer number of amplifiers as compared to many conventional ADC architectures. In particular, at any given point in time, only one clock phase $\Phi_1$ and $\Phi_2$ is asserted, thereby allowing the amplifiers to be shared between the lanes.

Further, one of the lanes finishes processing a second MDAC stage ($\Phi_{MD2}$ is de-asserted) and the second residue voltage is provided for further quantization (e.g., by a flash ADC that generates LSBs), the lane can then start processing a subsequent analog input voltage. In this manner, high throughput operation is enabled using a pipeline ADC architecture.

Figure 9A:
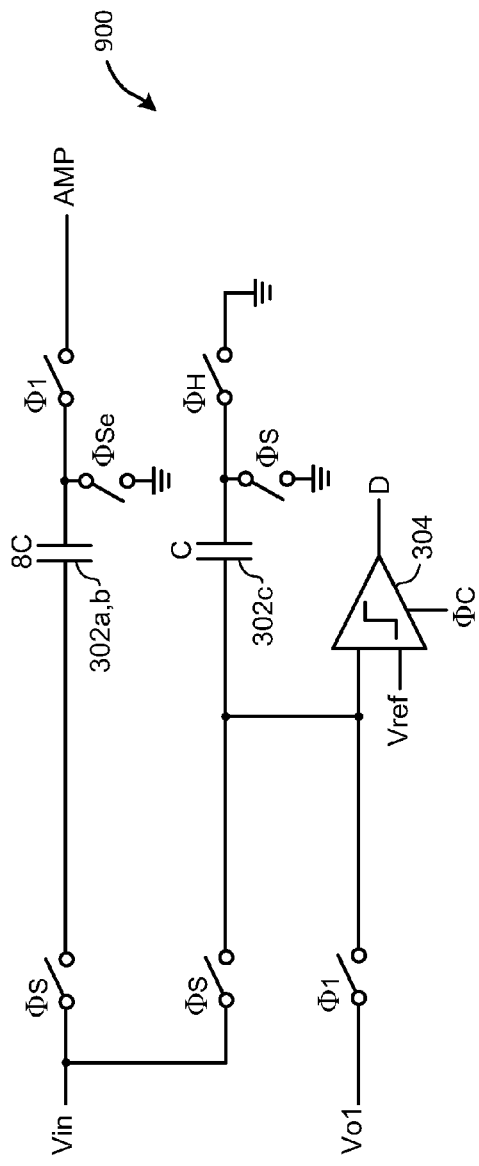
FIGS. 9a and 9b illustrate a generalized circuit diagram and associated timing diagram for an exemplary quantization path.
Figure 9B:
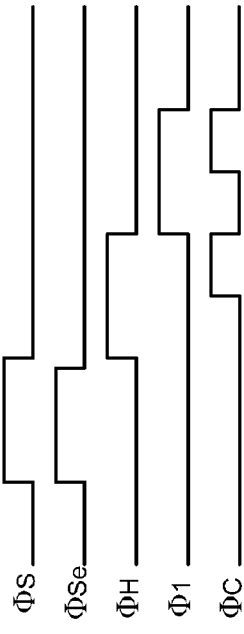

FIGS. 9a and 9b illustrate a generalized circuit diagram and associated timing diagram 900 for an exemplary quantization path. In operation, an input signal is sample to capacitors 302a,b and capacitor 302c during a clock phase $\Phi_S$. The switches controlled by $\Phi_S$ are then opened (a clock phase $\Phi_{SE}$, which is de-asserted slightly before $\Phi_S$, may be utilized to mitigate switching noise) and clock phase $\Phi_H$ is asserted to hold the sampled voltage across capacitor 302c. During this clock phase, the clock phase $\Phi_C$ is also asserted such that the comparator 304 performs a comparison (or quantization) of the voltage across capacitor 302c to a reference voltage Vref in order generate a first quantization output bit(s).

Next, clock phase $\Phi_1$ is asserted, resulting a residue voltage Vo1 at the output of an amplifier used for an MDAC stage. During this clock phase, the clock phase $\Phi_C$ is again asserted such that the comparator 304 performs a second comparison (or quantization) of the residue voltage to a reference voltage Vref in order generate a second quantization bit(s).

Figure 10:
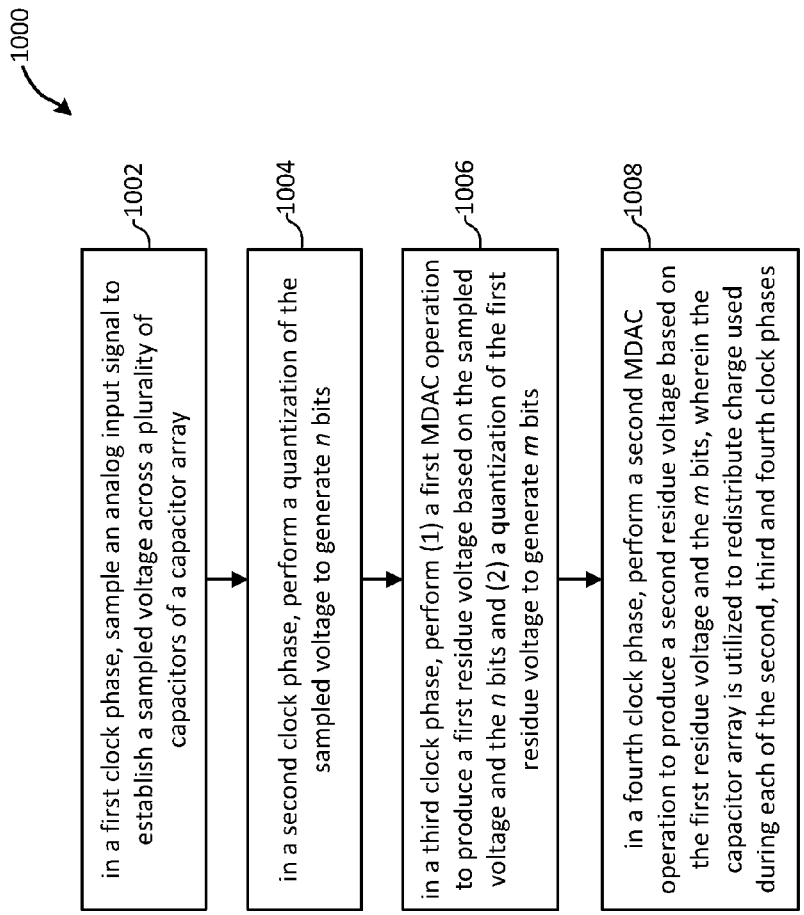
FIG. 10 is an operational flow diagram illustrating an exemplary method for analog-to-digital signal conversion.

FIG. 10 is an operational flow diagram 1000 illustrating an exemplary method for analog-to-digital signal conversion. The method may be practiced, for example, in a multi-lane ADC that includes a capacitor array in each lane. The illustrated method 1000 may be performed in a single lane of the ADC.

The method commences (1002) during a first clock phase in which an analog input signal is sampled and stored across multiple capacitors of the capacitor array to establish a sampled voltage for use in subsequent conversion stages (or steps). Next (1002), in a second clock phase, a first quantization is performed on the sampled voltage. The first quantization stage may be performed by one or more comparators (e.g., two comparators in a 1.5b MDAC implementation) of the lane, and generates the first n bits of a digital representation of the sampled voltage. In certain embodiments, the first quantization stage utilizes a sampled voltage stored in a single unit capacitor of the capacitor array.

In a third clock phase (1006), a first MDAC operation is performed to produce a first residue voltage. Charge is distributed across portions of the capacitor array during this clock phase such that the first residue voltage is based on the sampled voltage and a voltage derived from the n bits and a reference voltage(s). In the illustrated method, a quantization of the first residue voltage is also performed during the third clock to produce the next m bits of the digital representation of the sampled voltage. In some embodiments, n may equal m, in which case the same number of comparators is utilized by each quantization stage.

Next (1008), in a fourth clock phase, a second MDAC operation is performed to produce a second residue voltage. Charge is again distributed across portions (e.g., a feedback portion as described above) of the capacitor array during this clock phase such that the second residue voltage is based on the first residue voltage and a voltage derived from the m bits and a reference voltage(s). In this manner, the capacitor array is utilized to redistribute charge used during conversion stages/operations performed during each of the second clock phase, the third clock phase and the fourth clock phase. As described elsewhere herein, amplification for the first and second MDAC operations may be performed by a plurality of amplifiers shared by multiple lanes of the ADC in an interleaved manner.

Further, the method of FIG. 10 may be generalized to support N stages corresponding to N clock phases. For example, when N is a number greater than four, N−2 MDAC stages could be performed using further charge redistribution in the capacitor array to generate additional residue voltages for use in N−3 additional quantization stages. In this example, the lanes of the ADC may share N−2 amplifiers.

As may be used herein, the term "associated with", includes direct and/or indirect association of separate items and/or one item being embedded within another item. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to" or "operably coupled to" indicates that an item includes one or more of power connections, input(s), output(s), etc., to perform, when activated, one or more its corresponding functions and may further include inferred coupling to one or more other items.

The term "module" is used in the description of one or more of the embodiments. A module includes a processing module, a processor, a functional block, hardware, and/or memory that stores operational instructions for performing one or more functions as may be described herein. Note that, if the module is implemented via hardware, the hardware may operate independently and/or in conjunction with software and/or firmware. As also used herein, a module may contain one or more sub-modules, each of which may be one or more modules.

As may also be used herein, the terms "processing module", "processing circuit", "processing circuitry", "processor" and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments of the present disclosure have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed subject matter. One of average skill in the art will also recognize that the functional building blocks, and other illustrative blocks, modules and components herein, can be implemented as illustrated or by discrete components, application specific integrated circuits, processors executing appropriate software and the like or any combination thereof.

The one or more embodiments are used herein to illustrate one or more aspects, one or more features, one or more concepts, and/or one or more examples of the claimed subject matter. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contrary, signals to, from, and/or between elements in a figure presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. An analog-to-digital converter (ADC) comprising:
   a plurality of N lanes, each lane of the N lanes including:
      a capacitor array; and
      a plurality of switches coupled to the capacitor array, the plurality of switches configured to cause the capacitor array to selectively redistribute a sampled charge during N clock phases corresponding to N stages, wherein the N stages include a sampling stage performed on an analog input signal, a first quantization stage, and N−2 multiplying digital-to-analog conversion (MDAC) stages for generating residue voltages; and
   a plurality of N−2 amplifiers coupled to and shared by the N lanes, wherein each amplifier of the N−2 amplifiers is configured to support, during a given clock phase, an MDAC stage of a lane of the N lanes.

2. The ADC of claim 1, each MDAC stage including amplification of a residue voltage, wherein the amplification is performed by redistributing a charge stored in a first portion of the capacitor array to a second portion of the capacitor array.

3. The ADC of claim 1, each lane of the N lanes further including:
    at least one comparator coupled to the capacitor array and configured to generate at least one bit of a digital representation of the analog input signal during the first quantization stage.

4. The ADC of claim 3, the N stages further including N−3 additional quantization stages, wherein the at least one comparator is further configured to generate, based on a residue voltage, at least one additional bit of the digital representation of the analog input signal during each of the N−3 additional quantization stages.

5. The ADC of claim 4, wherein each of the N−3 additional quantization stages of a lane occurs during an MDAC stage of the N−2 MDAC stages of the lane.

6. The ADC of claim 1, wherein during an MDAC stage of the N−2 MDAC stages of a lane, the plurality of switches are configured to separate capacitors of the capacitor array into a reference portion coupling at least one reference voltage to an input of an amplifier of the plurality of N−2 amplifiers, and a feedback portion coupling the input and an output of the amplifier.

7. The ADC of claim 6, wherein during the MDAC stage a residue voltage is stored in the feedback portion of the capacitor array, the plurality of switches configured to distribute the residue voltage for use in a subsequent MDAC stage without sampling the residue voltage to another capacitor.

8. The ADC of claim 1, wherein N equals four.

9. The ADC of claim 1, wherein at least one MDAC stage of the N−2 MDAC stages is a 1.5 bit MDAC stage.

10. A method for use in an analog-to-digital converter (ADC) having a capacitor array, comprising:
    in a first clock phase, sampling an input signal to establish a sampled voltage across a plurality of capacitors of the capacitor array;
    in a second clock phase, performing a quantization of the sampled voltage, of at least one of the plurality of capacitors, to generate n bits;
    in a third clock phase, performing a first multiplying digital-to-analog (MDAC) operation to produce a first residue voltage based on the sampled voltage and the n bits, and further performing a quantization of the first residue voltage to generate m bits; and
    in a fourth clock phase, performing a second MDAC operation to produce a second residue voltage based on the first residue voltage and the m bits, wherein the capacitor array is utilized to redistribute charge used during each of the second clock phase, the third clock phase and the fourth clock phase.

11. The method of claim 10, wherein the first MDAC operation utilizes a first amplifier and the second MDAC operation utilizes a second amplifier.

12. The method of claim 11, wherein the capacitor array is included in one lane of an N plurality of lanes, and the first amplifier and the second amplifier are included in an N−2 plurality of amplifiers shared by the N plurality of lanes, further comprising:
    performing interleaved N−2 MDAC stages across the N plurality of lanes in N−2 clock phases using the N−2 plurality of amplifiers.

13. The method of claim 12, wherein N equals four.

14. The method of claim 10, wherein performing the quantization of the sampled voltage and the quantization of the first residue voltage utilizes at least one common comparator.

15. The method of claim 10, wherein at least one of the first MDAC operation and the second MDAC operation is a 1.5 bit MDAC operation.

16. A device comprising:
    an analog-to-digital converter (ADC) circuit including:
        a plurality of N lanes, each lane of the N lanes including:
            a capacitor array; and
            a plurality of switches coupled to the capacitor array, the plurality of switches configured to cause the capacitor array to selectively redistribute a sampled charge during N clock phases corresponding to N stages, wherein the N stages include a sampling stage performed on an analog input signal, a first quantization stage, and N−2 multiplying digital-to-analog conversion (MDAC) stages for generating residue voltages; and
        a plurality of N−2 amplifiers coupled to and shared by the N lanes, wherein each amplifier of the N−2 amplifiers is configured to support, during a given clock phase, an MDAC stage of a lane of the N lanes.

17. The device of claim 16, each MDAC stage including amplification of a residue voltage, wherein the amplification is performed by redistributing a charge stored in a first portion of the capacitor array to a second portion of the capacitor array.

18. The device of claim 16, each lane of the N lanes further including:
    at least one comparator coupled to the capacitor array and configured to generate a plurality of bits of a digital representation of the analog input signal during the first quantization stage; and
    the N stages further including N−3 additional quantization stages, wherein the at least one comparator is further configured to generate, based on a residue voltage, an additional plurality of bits of the digital representation of the analog input signal during each of the N−3 additional quantization stages.

19. The device of claim 18, wherein each of the N−3 additional quantization stages of a lane occurs during an MDAC stage of the N−2 MDAC stages of the lane.

20. The device of claim 16, wherein N equals four.

* * * * *